US00RE35221E

United States Patent [19]

Reay

[11] E Patent Number: Re. 35,221

[45] Reissued Date of Patent: Apr. 30, 1996

[54] SCHOTTKY ENHANCED CMOS OUTPUT CIRCUIT

[75] Inventor: Robert L. Reay, Mountain View, Calif.

[73] Assignee: Linear Technology Corporation, Milpitas, Calif.

[21] Appl. No.: 61,628

[22] Filed: May 13, 1993

Related U.S. Patent Documents

Reissue of:

[64] Patent No.: 5,015,889
Issued: May 14, 1991
Appl. No.: 314,378
Filed: Feb. 23, 1989

[51] Int. Cl.[6] ..... H03K 19/20; H03K 19/094

[52] U.S. Cl. ..... 326/121; 326/116; 326/83

[58] Field of Search ..... 307/451, 475, 307/448, 446, 529, 585, 473; 326/121, 116, 83

[56] References Cited

U.S. PATENT DOCUMENTS

| | | | |
|---|---|---|---|
| 4,023,122 | 5/1977 | Oura | 307/581 |
| 4,578,600 | 3/1986 | Magee | 307/451 |
| 4,740,713 | 4/1988 | Sakurai et al. | 307/451 |
| 4,791,321 | 12/1988 | Tanaka et al. | 307/451 |
| 4,801,983 | 1/1989 | Ueno et al. | 307/446 |
| 4,996,449 | 2/1991 | Ueno | 307/446 |
| 5,097,153 | 3/1992 | Mahler et al. | 307/446 |
| 5,233,237 | 8/1993 | Ohannes et al. | 307/446 |

FOREIGN PATENT DOCUMENTS

| | | |
|---|---|---|
| 0064828 | 4/1983 | Japan . |
| 0260426 | 11/1987 | Japan . |

*Primary Examiner*—Edward P. Westin
*Assistant Examiner*—Richard Roseen
*Attorney, Agent, or Firm*—Fish & Neave; Mark D. Rowland; Michael J. DeHaemer

[57] ABSTRACT

The high impedance state of a tri-state CMOS transistor output circuit is enhanced by serially connecting first and second Schottky diodes with the P-channel transistor and the N-channel transistor whereby in the high impedance state reverse bias of the substrate/source-drain diodes of the two transistors is prevented when the output of the circuit is taken beyond the supply voltage potentials of the output circuit.

14 Claims, 1 Drawing Sheet

SCHOTTKY ENHANCED CMOS OUTPUT CIRCUIT

Matter enclosed in heavy brackets [ ] appears in the original patent but forms no part of this reissue specification; matter printed in italics indicates the additions made by reissue.

BACKGROUND OF THE INVENTION

This invention relates generally to semiconductor integrated circuits, and more particularly the invention relates to CMOS output circuit.

The standard CMOS output circuit as used in interfacing one of a plurality of devices to a common bus, for example, has an input signal applied to both gates of the CMOS transistor pair, and an inverted output is taken at the common terminal of the two serially-connected transistors. The output circuit can assume a high impedance state (i.e., tri-state) by taking the gate of the P-channel transistor high and the gate of the N-channel transistor low. However, since different peripheral devices tied to common bus can have different operating voltage levels, which are selectively applied to the bus, an output circuit can have a voltage applied to its output terminal which is greater in magnitude than the supply voltages for that output circuit. In this circumstance, the substrate/source-drain diodes of the transistors can forward bias thus loading the common bus and causing potential latchup problems.

SUMMARY OF THE INVENTION

An object of the invention is a CMOS output circuit having an enhanced high impedance state.

A future of the invention is a provision of Schottky diodes in series with the transistors of a CMOS output circuit to prevent forward bias of the substrate/source-drain diodes when the circuit is in a high impedance state.

The invention and objects and the futures thereof will be more readily apparent from the following detailed description and the appended claims when taken with the drawings.

DETAILED DESCRIPTION OF THE ILLUSTRATED EMBODIMENT

Figure 1:
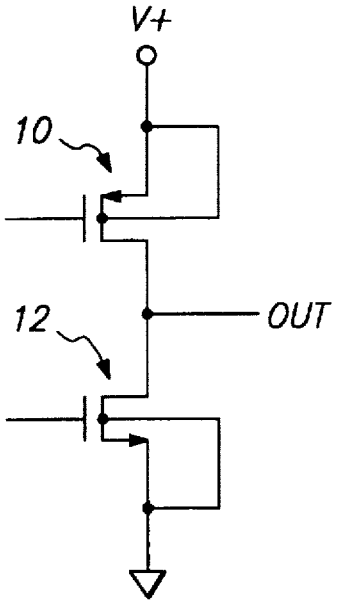
FIG. 1 (PRIOR ART)
FIG. 1 is a schematic of a conventional CMOS output circuit.

FIG. 1 is a schematic of a conventional CMOS output circuit. A P-channel transistor 10 is serially connected with an N-channel transistor 12 between a positive voltage potential (V+) and ground. The input signals to the circuit (PEN and NEN) are applied to the gates of the transistors 10, 12, and the output of the circuit is taken at the common terminal of the two transistors.

As noted above, the CMOS output circuit can be employed to connect a device to a bus shared with other devices. The circuit can isolate the device from the bus through the application of a high voltage potential to the gate of the P-channel transistor 10 and a low voltage to the gate of the N-channel transistor 12. In this mode both transistors are turned off thus isolating the output terminal. However, as noted above, various devices connected to a common bus can have different operating voltages. Thus, the voltage level on the bus can be beyond the voltage levels For the output circuit.

In this condition, the substrate/source-drain diodes of the transistor devices can forward bias and inject current into the substrate thereby causing latchup problems and undesirably loading the common bus.

Figure 2:
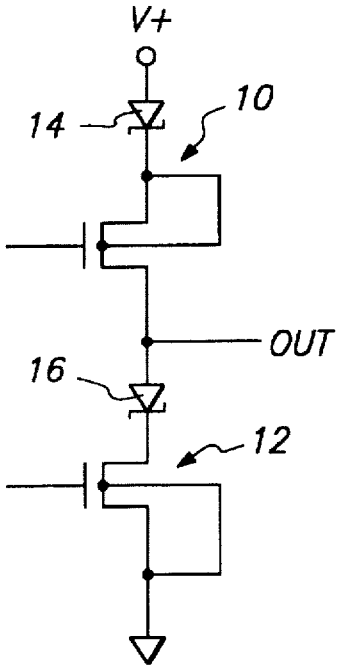
FIG. 2 is a schematic of a CMOS output circuit in accordance with one embodiment of the invention.

In accordance with the present invention, Schottky diodes 14 and 16 are serially connected with the transistors 10 and 12 as illustrated in the schematic of FIG. 2. The presence of the Schottky diode 14 prevents the drain-substrate diode of the P-channel transistor from forward biasing even though the output voltage exceeds V+. Similarly, Schottky diode 16 prevents the substrate-drain diode of N-channel transistor 12 from forward biasing even though the output voltage is below ground potential. Because the Schottky diodes will not forward bias and inject current into the substrate, the circuit will be free from latchup problems.

Figure 3:
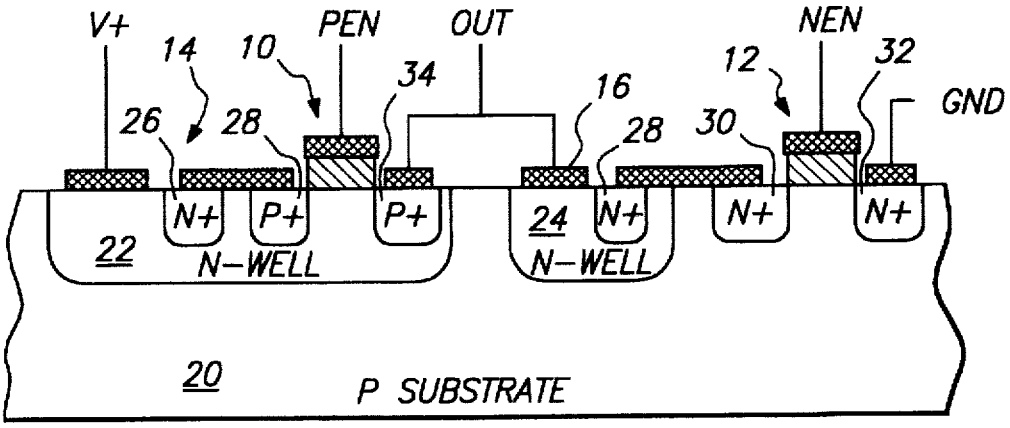
FIG. 3 is a section view of a semiconductor circuit illustrating the CMOS output circuit of FIG. 2.

The Schottky diodes can be formed in a semiconductor device structure from a normal metal (e.g. aluminum) to N-well junction in a standard N-well CMOS process. Such a structure is illustrated in the cross-sectional view of a CMOS device of FIG. 3. The device is fabricated in a P-substrate 20 with the P-channel transistor 10 formed in an N-well 22 and the N-channel of transistor 12 formed directly in the P-substrate 20. Schottky diode 14 is formed by an aluminum contact directly contacting the N-well 22, while the Schottky diode 16 is formed by a metal contacting N-well 24. An N+diffusion 26 is provided in N-well 22 to facilitate contact to the well. Similarly, an N+diffusion 28 is formed in N-well 22 to facilitate the contact to the N-well. The source 32 of the N-channel transistor is connected to ground, while the drain 34 of the P-channel transistor 10 is connected to the output terminal and to Schottky diode 16.

The provision of Schottky diodes in a CMOS output stage circuit facilitates the high impedance state of the output circuit without forward biasing of the substrate/source-drain diodes of the transistor structures.

The Schottky diodes are readily fabricated using conventional processing technology and conventional cell structures as described above. In the described embodiment the Schottky diode 14 must be placed between V+ and the transistor 10 because of the N-well configuration including the Schottky diode, the transistor, and the output connection. The diode could be placed between transistor 10 and the output terminal if the N-well could be isolated from the substrate. Similarly, Schottky diode 16 could between transistor 12 and ground if the N-well could be isolated from the substrate.

Thus, while the invention has been described with reference to a specific embodiment, the description is illustrative of the invention and not to be construed as limiting the invention. Various modifications and applications may occur to those skilled in the art without departing from the true spirit and scope of the invention as defined by the appended claims.

What is claimed is:

1. A CMOS output circuit comprising:

first and second voltage potentials;

a P-channel transistor having source, drain, and gate electrodes and an N-channel transistor having source, drain, and gate electrodes;

first input terminal means for applying a first input signal to said gate of said P-channel transistor;

second input terminal means for applying a second input signal to said gate electrode of said N-channel transistor;

a first Schottky diode connecting said source electrode of said P-channel transistor to said first voltage potential;

means connecting said source electrode of said N-channel transistor to said second voltage potential;

an output terminal connected to said drain electrode of said P-channel transistor; and a second Schottky diode connecting said output terminal to said drain electrode of said N-channel transistor.

2. The CMOS output circuit as defined by claim 1 wherein said first voltage potential is more positive than said second voltage potential, said first Schottky diode being forward biased for current flow from said first voltage potential to said source electrode of said P-channel transistor, and said second Schottky diode being forward biased between said output terminal and said drain electrode of said N-channel transistor.

3. The CMOS output circuit as defined by claim 2 wherein said transistors are fabricated in a P-conductivity silicon substrate, said first and second Schottky diodes comprising N-doped wells in a surface of said substrate with respective metal contacts on the surfaces of the N-wells.

4. The CMOS output circuit of claim 3 wherein said first and second Schottky diodes further include respective N+ regions to facilitate contact with said respective metal contacts.

5. A CMOS output circuit comprising:

first and second voltage potentials;

a P-channel transistor;

an N-channel transistor;

first input terminal means for applying a first input signal to a gate electrode of said P-channel transistor;

second input terminal means for applying a second input signal to a gate electrode of said N-channel transistor;

a first Schottky diode serially connected with said P-channel transistor between said first voltage potential and an output terminal; and a second Schottky diode serially connected with said N-channel transistor between said output terminal and said second voltage potential.

*6. In an output circuit having an output terminal and first and second transistors which respectively couple first and second voltage potentials to said output terminal responsive to input signals applied to control electrodes of said first and second transistors, wherein at least one of said first and second transistors is an MOS transistor, an improvement comprising:*

*a Schottky diode in series with said MOS transistor between said output terminal and one of said first and second voltage potentials.*

*7. The output circuit of claim 6, wherein said MOS transistor is a P-channel transistor.*

*8. The output circuit of claim 7, wherein said first voltage potential is more positive than said second voltage potential, said Schottky diode being forward biased for current flow from said first voltage potential to a source electrode of said P-channel transistor.*

*9. The output circuit of claim 8, wherein said Schottky diode connects said source electrode of said P-channel transistor to said first voltage potential, and a drain electrode of said P-channel transistor is connected to said output terminal.*

*10. The output circuit of claim 6, wherein said MOS transistor is an N-channel transistor.*

*11. The output circuit of claim 10, wherein said first voltage potential is more positive than said second voltage potential, said Schottky diode being forward biased for current flow from said output terminal to a drain electrode of said N-*channel transistor.

*12. The output circuit of claim 11, wherein said Schottky diode connects said drain electrode of said N-channel transistor to said output terminal, and a source electrode of said N-channel transistor is connected to said second voltage potential.*

*13. The output circuit as defined by claims 6, 7, 8, 9, 10, 11 or 12 wherein said Schottky diode comprises an N-doped well in a surface of a P-conductivity silicon substrate, with a metal contact on the surface of said N-well.*

*14. The output circuit of claim 13 wherein said Schottky diode further includes an N+ region to facilitate contact with said metal contact.*

* * * * *